United States Patent [19]
Bean et al.

[11] Patent Number: 5,096,840
[45] Date of Patent: Mar. 17, 1992

[54] METHOD OF MAKING A POLYSILICON EMITTER BIPOLAR TRANSISTOR

[75] Inventors: John C. Bean, New Providence; Gregg S. Higashi, Basking Ridge, both of N.J.; Bahram Jalali-Farahani, South Hempstead; Clifford A. King, New York, both of N.Y.

[73] Assignee: AT&T Bell Laboratories, Murray Hill, N.J.

[21] Appl. No.: 567,835

[22] Filed: Aug. 15, 1990

[51] Int. Cl.[5] .................... H01L 21/265; H01L 29/73
[52] U.S. Cl. ........................ 437/24; 437/31; 437/186; 437/233; 148/DIG. 10
[58] Field of Search ...................... 437/31, 27, 28, 30, 437/233, 186, 24; 148/DIG. 10

[56] References Cited

U.S. PATENT DOCUMENTS 4,818,711  4/1989  Choksi et al. ................ 437/233
4,853,342  8/1989  Taka et al. ................ 148/DIG. 10

FOREIGN PATENT DOCUMENTS 0175417  9/1985  Japan ................ 437/186
0185019  7/1990  Japan ................ 437/24

OTHER PUBLICATIONS

"Polysilicon Emitter Bipolar Transistors", edited by A. K. Kapoor et al., IEEE Press, 1989, pp. 3-16.

Primary Examiner—Olik Chaudhuri
Assistant Examiner—Long Pham
Attorney, Agent, or Firm—Eugene E. Pacher

[57] ABSTRACT

The inventive method of making a poly-Si emitter transistor (PET) comprises opening an emitter window in a dielectric (typically $SiO_2$) layer, and depositing onto the thus exposed surface and/or into the single crystal Si material that underlies the exposed surface at least one atomic species. This deposition step is following by the conventional poly-Si deposition, dopant implantation and "drive-in". In a currently preferred embodiment the novel deposition step comprises a low dose, low energy As implantation ($5 \times 10^{13} - 2 \times 10^{15}$ atoms/$cm^2$, 0.1-5 keV). The novel method can result in significantly improved device characteristics, e.g., in a doubling of $h_{FE}$, as compared to analogous prior art PETs.

9 Claims, 1 Drawing Sheet

METHOD OF MAKING A POLYSILICON EMITTER BIPOLAR TRANSISTOR

FIELD OF THE INVENTION

This invention pertains to methods of making Si-based transistors.

BACKGROUND OF THE INVENTION

In a recently published monograph ("Polysilicon Emitter Bipolar Transistors", A. K. Kapoor et al., editors, IEEE Press, 1989, page 3) can be found the following: "Bipolar technology has always been *the* technology of choice when high performance (high speed and high driving ability) is the prime concern. Emitter coupled logic (ECL) is a typical and familiar example. Despite the distinctively superior electrical characteristics displayed by bipolar transistors compared with MOSFETs ..., bipolar chips had the long-standing disadvantages of high power consumption and low packing density. Polysilicon emitter transistor (PET) technology has emerged now as the cutting-edge bipolar technology dramatically overcoming the traditional disadvantages. The PET has ushered bipolar technology into VLSI ...".

PETs are well known to those skilled in the art. See, for instance, the article by C. R. Selvakumar in the above cited monograph (pp. 3-16), which is incorporated herein by reference. A version of PETs that is currently of particular interest comprises a highly doped polysilicon layer, overlying the base, that serves both as a diffusion source for shallow (emitter/base) junction formation and as a means for contacting the shallow emitter region. Typically, after the conventional base processing and emitter window opening steps, undoped polysilicon is deposited, subsequently implanted with a precise amount of arsenic atoms, followed by a heat treatment to anneal out damage and to form the emitter/base junction.

As reviewed in the above cited article on page 4, one of the crucial steps in PET manufacture is the treatment given to the wafer just prior to the deposition of the polysilicon. The many different prior art treatments can be roughly grouped into two categories. The first one involves an intentional or unintentional growth of a thin oxide layer (0.2 to 2 nm). The second involves the growth of a thin thermal nitride layer (about 1.0 to 1.5 nm). The "interface" treatment is important because it can have a pronounced effect on the electrical characteristics of PETs.

One of the advantages of PETs is their typically high current gain, as compared to conventional metal emitter transistors. Many different theories have been put forward to explain the origin of the enhanced current gain. For a concise review, see the above cited article, especially pages 5-12. Among the proposed mechanisms invoked are smaller bandgap narrowing in the polysilicon; the presence of a tunneling layer between the polysilicon and the underlying single crystal Si; smaller hole mobility in the polysilicon, as compared to the single crystal Si; and dopant pile-up at the interface. As summarized by Selvakumar (op. cit.), the theoretical models can be grouped under two categories, namely a) those based on barrier theories involving either tunneling or thermionic emission over i) an oxide barrier or ii) a doping barrier due to pile-up at the interface, and b) those that are based on the carrier transport through the polysilicon film.

Despite the plethora of proposed mechanisms, none of the known theoretical models can account for all the experimental observations. Thus it is clear that theory can not yet provide reliable guidance to the worker who seeks to improve PET characteristics.

As stated by Selvakumar (op. city. page 12)" ... a thin interfacial oxide layer helps to obtain very high current gains in PETs which could be traded ... for low base resistances by doping the base more heavily. Unfortunately, the interfacial oxide layer impedes the flow of majority carriers and, hence, gives rise to a higher emitter resistance. Therefore PETs with as thin an oxide layer as possible are often sought in practice ...". Decreased base resistance would be highly desirable because it can result in higher operating speed. Increased emitter resistance is undesirable because it results in reduced speed and higher power consumption.

A consequence of the importance of (difficult to control and reproduce) interface conditions in PETs is the known difficulty in obtaining gain uniformity for devices on a given wafer, and/or between wafers. This is a severe drawback in VLSI and has caused designers to sacrifice potentially available gain.

In view of the importance of PETs it would be very desirable to have available a method of making PETs that can reliably result in devices with uniformly improved characteristics, e.g., in PETs with decreased base resistance but substantially unchanged current gain and emitter resistance, all as compared to an analogous prior art PET. This application discloses such a method.

DEFINITIONS AND GLOSSARY

Figure 1:
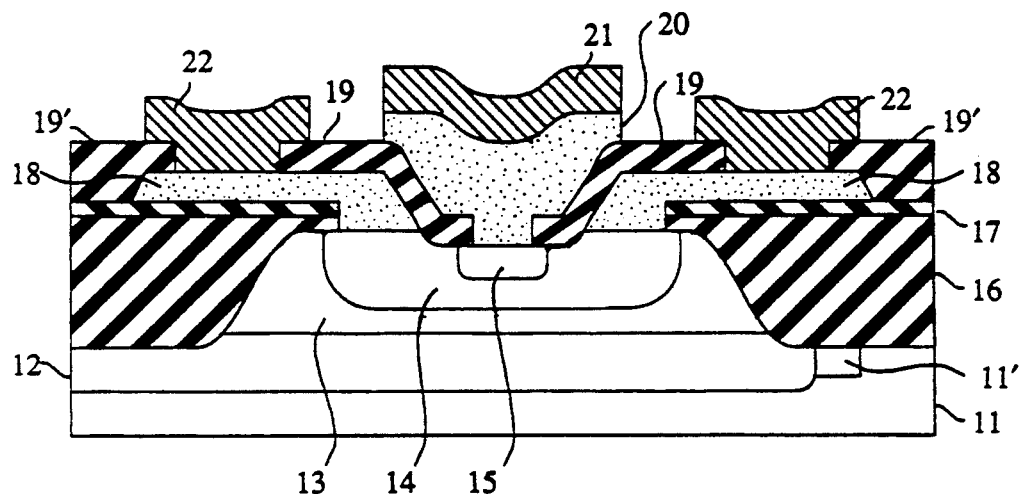
FIG. 1 schematically depicts an exemplary PET structure.

By an "atomic species" we mean herein atomic particles, charged or uncharged, of any given chemical element.

By an "impurity" species we mean herein an atomic species other than the species that is the main constituent of a host material. For instance, Ar or As atoms, present in a Si body, are impurity atoms in the body.

By a "dopant" species we mean herein an impurity species which is caused to be present in a host material to affect the electronic properties of the material. A dopant species necessarily is an impurity species, but the reverse is not necessarily the case. For instance, As atoms, caused to be present in a Si body to make a portion of the body n-type, are dopant atoms in the body.

By "depositing" an atomic species onto a surface and/or into the material underlying the surface we mean any activity that results in at least a temporary accumulation of the atomic species on the surface or in the material that underlies the surface. Exemplary techniques for depositing an atomic species onto and/or into a Si body are ion implantation (e.g., of Si, Ar or As), spin-on (e.g., of As-containing material), vapor deposition and sputter deposition.

THE INVENTION

In a broad aspect the invention is a method of producing an improved PET, exemplarily a PET having decreased base resistance, as compared to a comparison prior art PET.

More specifically, the inventive method comprises a novel interface treatment. Still more specifically, the method comprises providing a single crystal Si body having a major surface, forming in the body a first region of a first conductivity type (herein designated the "collector" region), forming in the body a region of a second conductivity type (herein designated "base" region), with at least a portion of the base region located between the major surface and the collector region, depositing one or more layers of material, including a dielectric layer, on the major surface and patterning at least the dielectric layer such that a portion of the base region is exposed. The method further comprises depositing a layer of polycrystalline Si (poly-Si) such that the poly-Si essentially covers the exposed portion of the base region.

Significantly, the inventive method comprises a step, carried out prior to deposition of the poly-Si layer, that comprises depositing at least one atomic species on the surface of said exposed portion and/or within the material that underlies the surface of said exposed portion. The step can, but need not, comprise low energy implantation, typically of an impurity species, frequently of a dopant species. For instance, the impurity species can be placed onto the surface of the exposed portion by a spin-on technique, or by another known technique such as evaporation or sputtering.

In the above referred-to poly-Si layer there are caused to be present atoms of the type that can induce in single crystal Si conductivity of the first type. In a currently preferred embodiment of the invention, these dopant atoms are the same chemical element as the atomic species previously caused to be present at, or close to, the surface of the (previously) exposed portion. Conventionally, the dopant atoms are implanted into the poly-Si layer. At least some of the dopant atoms from the poly-Si layer are then caused to move into the single crystal body such that a further region of the first conductivity type is formed (herein referred to as the "emitter" region) such that the emitter and collector regions are separated by the base region. The inventive method further comprises one or more, typically conventional, steps towards completion of the transistor. These steps can include one or more of photolithography, etching, metal deposition, dicing, and chip packaging. Transistors produced according to the invention typically are part of an integrated circuit. Integrated circuits are generally produced by a process that involves dividing a processed wafer into a multiplicity of parts, with at least one of the parts comprising an integrated circuit.

Currently preferred embodiments of the invention comprise deposition of a relatively small number (typically $10^{13}$–$10^{16}$ atoms/cm$^2$) of impurity atoms onto the surface of the exposed portion of the single crystal Si body and/or into the portion of the body that immediately underlies the surface of the exposed portion. The currently preferred impurity atom species is a dopant species, namely As. Doses outside of the above recited preferred ranges may under some circumstances yield acceptable results. Furthermore, atomic species other than As (including other n-type dopants such as P and Sb, and p-type dopants such as B, and not excluding electronically inert impurity atoms such as Ar and atomic species such as Si) can be used in the practice of the invention, even though to date best results were obtained with n-p-n PETs in which As was deposited prior to formation of the poly-Si layer. Implantation with Si and/or Ar may introduce some damage into the interface region, and light damage can not be ruled out as a possible factor in the observed improvement in PETs according to the invention.

FIG. 1 schematically depicts an exemplary PET structure 10. As those skilled in the art will recognize, FIG. 1 can be considered to depict a portion of a VLSI chip that contains one or more PETs, possibly other active devices, and conventional interconnection means and input and output means. These can be conventional and do not require illustration.

PET 10 contains p$^-$ Si substrate 11, n$^+$ subcollector region 12, p$^+$ channel stop 11', n$^-$ collector region 13, p$^+$ base region 14, and n$^+$ emitter region 15. The PET further contains SiO$_2$ layer 16, dielectric layer 17, heavily p-doped poly-Si layer 18, SiO$_2$ layer 19 and 19', heavily n-doped poly-Si layer 20, and metallization layers 21 and 22. Means for contacting the collector are conventional and are not shown. Emitter 15 typically is formed by out-diffusion of dopant atoms from the overlying poly-Si, with the dopant atoms having been implanted into the poly-Si subsequent to formation of the poly-Si layer.

A structure of the type shown in FIG. 1 (or other PET structure) can be made by a process according to the invention. In particular, it can be made by a method that comprises an ion-implantation step after opening of the emitter-defining aperture in oxide layer 19, and before formation of poly-Si layer 20. Advantageously more than about $10^{13}$ ions/cm$^2$ are implanted into the exposed region of the Si body, since lower doses typically will not result in significant device improvement. Furthermore, in currently preferred embodiments the dose typically should not exceed $10^{16}$/cm$^2$, since higher doses will generally result in supersaturation. In currently preferred embodiments the dose is in the range $5\times 10^{13}$–$2\times 10^{15}$ ions/cm$^2$.

The ion implantation step is desirably carried out such that the implanted ions substantially are confined to a very thin layer of the Si body, typically less than about 10 nm. Typically the beam energy is in the range 0.1–5 keV, although values outside this range may under some circumstances give acceptable results.

EXAMPLE

Figure 2:
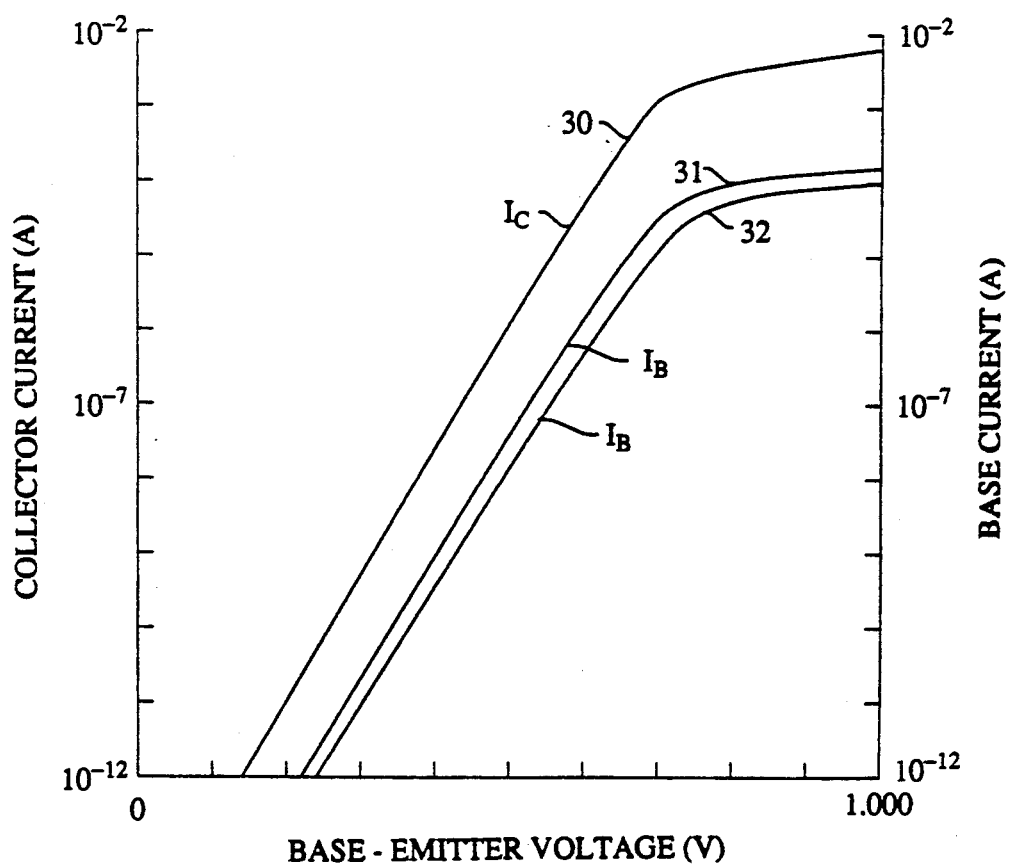
FIG. 2 shows collector and base currents versus base-emitter voltage for an exemplary PET device produced according to the invention, and for an otherwise identical PET produced according to the prior art.

A large area (emitter window size $100\times 400$ µm) PET was produced on a conventional n$^+$ (100) oriented 4 inch diameter single crystal Si wafer with a 5 µm, 0.5 Ωcm n-type epitaxial layer. Many of the steps, including photolithography, etching, poly-Si growth, SiO$_2$ growth, and metallization, were conventional. The base was formed by implantation of BF$_2$ at 30 keV, the dose selected to result in a peak carrier density p=1×10$^{18}$ cm$^{-3}$ in the base. Emitter windows were then opened in deposited SiO$_2$. The interface modification according to the invention was done in a UHV chamber, by exposing several of the emitter windows to a 3 keV As$_2^+$ beam. The flux $1.2\times 10^{10}$ ions/cm$^2$·s, and the exposure was timed to result in deposition of $10^{14}$ ions/cm$^2$. After completion of the deposition step the wafer was dipped in dilute HF, followed immediately by deposition of a 300 nm thick layer of poly-Si in a conventional low pressure chemical vapor deposition (LPCVD) reactor. This in turn was followed by a conventional emitter arsenic implantation (100 keV, $1 \times 10^{16}$ cm$^{-2}$), a 30 min anneal at 900° C. in argon, and conventional Ti/W and Al (5% Si) metallization that resulted in ohmic contacts to emitters, bases and collectors, respectively. DC measurements were carried out on the thus produced PETs, and FIG. 2 shows representative data. Collector current ($I_c$) versus $V_{BE}$ (base-emitter voltage) is given by curve 30. It is to be noted that curve 30 represents $I_c$ versus $V_{BE}$ for both a PET produced according to the invention (i.e., with As deposition onto the surface and/or into the material underlying the surface prior to emitter poly-Si formation) and for a PET produced according to the prior art (i.e., without As deposition prior to emitter poly-Si formation). The two devices clearly have essentially identical $I_c$ versus $V_{BE}$, indicative of the fact that the inventive treatment does not, under bias conditions representative of conventional operating bias, lead to a reduction of the electron flow from the emitter into the base. Curves 31 and 32 show base current ($I_B$) versus $V_{BE}$, for the PET produced according to the prior art and for the PET produced according to the invention, respectively. As is immediately obvious, at any given value of $V_{BE}$ within the relevant range the latter PET has significantly lower $I_B$ than the former, indicative of the fact that the inventive method can, over the entire bias range, reduce the flow of holes from the base into the emitter, as compared to an analogous prior art device. By an "analogous" prior art device we mean a device that is of identical design as the inventive device, that has identical dimensions, and that was produced by a process that differs from the inventive process only in not containing the atomic species deposition step before deposition of the poly-Si layer.

Although substantially any reduction in $I_B$ without increase in $I_c$ is significant, reduction by more than 50% (as is demonstrated by FIG. 2) is considered to be highly significant. As those skilled in the art will realize, the ability to reduce $I_B$ without increasing $I_E$ can translate into devices with increased current gain ($h_{FE} = I_c/I_B$), into devices with higher base doping levels and thus lower base resistance (and thus capable of greater speed), or into a combination of the two.

We claim:
1. Method of making a transistor comprising
    a) providing a single crystal Si body having a major surface;
    b) forming in the body a first region of a first conductivity type;
    c) forming in the body a region of a second conductivity type opposite to the first type, at least a portion of the region of the second conductivity type located between the major surface and the region of the first conductivity type;
    d) depositing one or more layers of material, including a dielectric layer, on the major surface, and patterning at least the dielectric layer such that a portion of the region of the second conductivity type is exposed;
    e) depositing a layer of polysilicon such that the polysilicon essentially covers said exposed portion, and causing to be present in the layer of polysilicon dopant atoms of the kind that can induce in single crystal Si the conductivity of the first type;
    f) causing at least some of the dopant atoms from the polysilicon layer to move into the single crystal body such that a second region of the first conductivity type is formed, the second region being separated from the first region by at least a portion of the region of the second conductivity type; and
    g) carrying out one or more further steps towards completion of the transistor;
    characterized in that the method further comprises
    h) depositing, prior to step e), at least one atomic species on the surface of said exposed portion and/or within the material that underlies the surface of said exposed portion, the deposition carried out such that said surface and material that underlies the surface are not amorphized whereby a transistor having low base resistance is produced.

2. Method of claim 1, wherein the atomic species is an impurity atom species.

3. Method of claim 1, wherein step h) comprises exposing said exposed portion to a flux of ions comprising the atomic species.

4. Method of claim 3, wherein the atomic species is an impurity atom species, associated with the flux of ions is an energy in the range 0.1–5 keV, and wherein deposition is carried out such that the areal density of ions in said exposed portion is greater than $10^{13}$ atoms/cm$^2$ and less than $10^{16}$ atoms/cm$^2$.

5. Method of claim 4, wherein the areal density is in the range $5 \times 10^{13} - 2 \times 10^{15}$ atoms/cm$^2$.

6. Method of claim 4, wherein the impurity atom species is the dopant atom species recited in step e).

7. Method of claim 1, wherein the first conductivity type is n-type conductivity, and the dopant atoms recited in step e) comprise As atoms.

8. Method of claim 1, wherein the transistor is part of an integrated circuit.

9. Method of claim 8, wherein step g) comprises dividing the processed Si body into a multiplicity of parts, with at least one of the parts comprising the integrated circuit.

* * * * *